United States Patent
Park et al.

(10) Patent No.: US 9,640,674 B2
(45) Date of Patent: May 2, 2017

(54) COMPOSITION FOR FORMING ELECTRODE OF SOLAR CELL AND ELECTRODE FORMED THEREOF

(71) Applicant: CHEIL INDUSTRIES, INC., Gumi-si, Gyeongsangbuk-do (KR)

(72) Inventors: Young Ki Park, Uiwang-si (KR); Dong Suk Kim, Uiwang-si (KR); Min Su Park, Uiwang-si (KR); Seok Hyun Jung, Uiwang-si (KR); Min Jae Kim, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 31 days.

(21) Appl. No.: 14/409,860

(22) PCT Filed: Mar. 20, 2013

(86) PCT No.: PCT/KR2013/002267
§ 371 (c)(1),
(2) Date: Dec. 19, 2014

(87) PCT Pub. No.: WO2014/126293
PCT Pub. Date: Aug. 21, 2014

(65) Prior Publication Data
US 2016/0013331 A1   Jan. 14, 2016

(30) Foreign Application Priority Data

Feb. 15, 2013 (KR) ........................ 10-2013-0016517

(51) Int. Cl.
*H01L 31/0224* (2006.01)
*H01B 1/16* (2006.01)
*H01B 1/22* (2006.01)

(52) U.S. Cl.
CPC ....... *H01L 31/022425* (2013.01); *H01B 1/16* (2013.01); *H01B 1/22* (2013.01); *Y02E 10/50* (2013.01)

(58) Field of Classification Search
None
See application file for complete search history.

(56) References Cited

U.S. PATENT DOCUMENTS

2011/0095240 A1   4/2011   Nakamura et al.

FOREIGN PATENT DOCUMENTS

| CN | 102081986 A | 6/2011 |
| CN | 102082187 A | 6/2011 |
| JP | 2007-294677 A | 11/2007 |
| JP | 2009-123333 A | 6/2009 |
| JP | 2011-510897 | 4/2011 |
| JP | 2011-096747 A | 5/2011 |
| JP | 2011-096748 | 5/2011 |
| JP | WO 2014050703 A | 8/2016 |
| KR | 10-2010-0075661 A | 7/2010 |
| KR | 10-2010-0125273 A | 11/2010 |
| KR | 10-2012-0045067 A | 5/2012 |
| KR | 10-2013-0016344 A | 2/2013 |

OTHER PUBLICATIONS

Chinese Office Action dated Dec. 17, 2015 in Corresponding Chinese Patent Application No. 201380035232.4.
International Search Report for PCT/KR2013/002267 filed on Mar. 20, 2013.
Korean Office Action for 10-2013-0016517 dated Apr. 21, 2015; Park, et al.
Japanese Office Action dated Sep. 6, 2016.

*Primary Examiner* — Tanisha Diggs
(74) *Attorney, Agent, or Firm* — Lee & Morse, P.C.

(57) ABSTRACT

Disclosed herein is a composition for solar cell electrodes. The composition includes a conductive powder, a glass frit, and an organic vehicle, wherein the glass frit is a bismuth oxide-tellurium oxide-zinc oxide-lithium oxide-based glass frit comprising: 5 wt % to 20 wt % of bismuth oxide; 55 wt % to 80 wt % of tellurium oxide; 0.1 wt % to 15 wt % of zinc oxide; and 0.1 wt % to 10 wt % of lithium oxide. Solar cell electrodes formed of the composition have low serial resistance (Rs) and high open voltage (Voc), thus providing high conversion efficiency and good adhesive strength with respect to a ribbon.

7 Claims, 1 Drawing Sheet

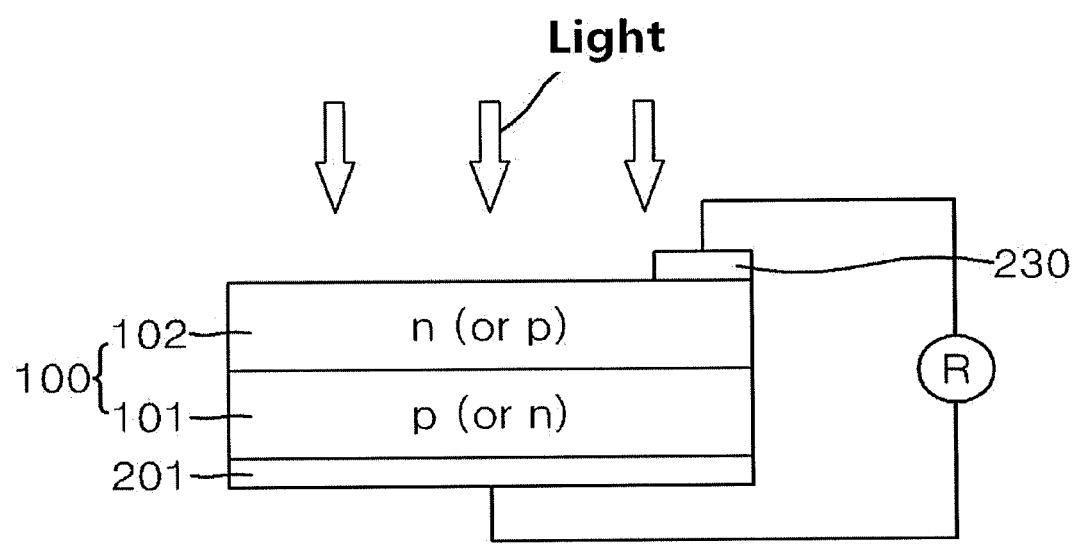

COMPOSITION FOR FORMING ELECTRODE OF SOLAR CELL AND ELECTRODE FORMED THEREOF

CROSS REFERENCE TO RELATED APPLICATIONS

This is the U.S. national phase application based on PCT Application No. PCT/KR2013/002267, filed on Mar. 20, 2013, which is based on Korean Patent Application No. 10-2013-0016517, filed Feb. 15, 2013, the entire contents of all of which is hereby incorporated by reference.

TECHNICAL FIELD

The present invention relates to a composition for solar cell electrodes and electrodes fabricated using the same.

BACKGROUND ART

Solar cells generate electric energy using the photovoltaic effect of a p-n junction which converts photons of sunlight into electricity. In the solar cell, front and rear electrodes are formed on upper and lower surfaces of a semiconductor wafer or substrate with the p-n junction, respectively. Then, the photovoltaic effect of the p-n junction is induced by sunlight entering the semiconductor wafer and electrons generated by the photovoltaic effect of the p-n junction provide electric current to the outside through the electrodes. The electrodes of the solar cell are formed on the wafer by applying, patterning, and baking a composition for electrodes.

Continuous reduction in emitter thickness for improvement of solar cell efficiency can cause shunting which can deteriorate solar cell performance. In addition, a solar cell has been gradually increased in area to achieve high efficiency. In this case, however, there can be a problem of efficiency deterioration due to increase in contact resistance of the solar cell.

Solar cells are connected to each other by a ribbon to constitute a solar cell battery. In this case, low adhesion between electrodes and the ribbon can cause large serial resistance and deterioration in conversion efficiency.

The inventor of the present invention developed a solar cell that provides necessary electrical properties such as conversion efficiency and physical properties such as adhesive strength.

DISCLOSURE

Technical Problem

It is an object of the present invention is to provide a composition for solar cell electrodes which exhibits excellent conversion efficiency and excellent adhesive strength between ribbons and electrodes.

Technical Solution

One aspect of the present invention relates to a composition for solar cell electrodes may include a conductive powder, a glass frit, and an organic vehicle, wherein the glass frit is a bismuth oxide-tellurium oxide-zinc oxide-lithium oxide-based glass frit comprising: 5% by weight (wt %) to 20 wt % of bismuth oxide; 55 wt % to 80 wt % of tellurium oxide; 0.1 wt % to 15 wt % of zinc oxide; and 0.1 wt % to 10 wt % of lithium oxide.

The glass frit may further include 0.1 wt % to 10 wt % of tungsten oxide ($WO_3$).

The glass frit may further include at least one metal oxide selected from the group consisting of a phosphorous oxide ($P_2O_5$), a silicon oxide ($SiO_2$), a magnesium oxide (MgO), a cerium oxide ($CeO_2$), a strontium oxide (SrO), a molybdenum oxide ($MoO_3$), a titanium oxide ($TiO_2$), a tin oxide (SnO), an indium oxide ($In_2O_3$), a vanadium oxide ($V_2O_5$), a barium oxide (BaO), a nickel oxide (NiO), a copper oxide ($Cu_2O$ or CuO), a sodium oxide ($Na_2O$), a potassium oxide ($K_2O$), an antimony oxide ($Sb_2O_3$, $Sb_2O_4$ or $Sb_2O_5$), a germanium oxide ($GeO_2$), a gallium oxide ($Ga_2O_3$), a calcium oxide (CaO), an arsenic oxide ($As_2O_3$), a cobalt oxide (CoO or $Co_2O_3$), a zirconium oxide ($ZrO_2$), a manganese oxide (MnO, $Mn_2O_3$ or $Mn_3O_4$), a lead oxide (PbO), an aluminum oxide ($Al_2O_3$), and a boron oxide ($B_2O_3$).

The glass frit may include 60 wt % to 80 wt % of tellurium oxide.

The composition may include 60 wt % to 95 wt % of the conductive powder; 0.5 wt % to 20 wt % of the glass frit; and 1 wt % to 30 wt % of the organic vehicle.

The glass frit may have an average particle diameter (D50) of 0.1 μm to 10 μm.

The conductive powder may include a silver (Ag) powder.

The conductive powder may have an average particle diameter (D50) of 0.1 μm to 10 μm.

The composition may further include at least one additive selected from the group consisting of dispersants, thixotropic agents, plasticizers, viscosity stabilizers, anti-foaming agents, pigments, UV stabilizers, antioxidants, and coupling agents.

Another aspect of the present invention relates to a solar cell electrode prepared from the composition for solar cell electrodes.

Advantageous Effects

The solar cell electrodes fabricated using the composition of the present invention have low serial resistance (Rs) and high open voltage (Voc), thereby exhibit high conversion efficiency and adhesive strength with respect to a ribbon.

DESCRIPTION OF DRAWINGS

FIG. 1 is a schematic view of a solar cell structure in accordance with one embodiment of the present invention.

BEST MODE

Composition for Solar Cell Electrodes

A composition for solar cell electrodes according to the present invention includes a conductive powder; a bismuth oxide-tellurium oxide-zinc oxide-lithium oxide-based glass frit; and an organic vehicle, and the composition minimizes serial resistance (Rs) to provide excellent conversion efficiency and has high adhesive strength with respect to a ribbon connecting solar cells to each other.

Now, the present invention will be described in more detail.

(A) Conductive Powder

The conductive powder may include at least one metal powder selected from the group consisting of silver (Ag), gold (Au), palladium (Pd), platinum (Pt), copper (Cu), aluminum (Al), nickel (Ni) and indium tin oxide (ITO)

powder, without being limited thereto. Advantageously, the conductive powder includes silver powder or mixtures including silver powder.

The conductive powder may have a nanometer or micrometer-scale particle size, for example, the conductive powder may have a particle size of dozens to several hundred nanometers, or a particle diameter of several to dozens of micrometers. Alternatively, the conductive powder may be a mixture of two or more types of conductive powders having different particle sizes.

The conductive powder may have a spherical, a flake or an amorphous particle shape.

The conductive powder preferably has an average particle diameter (D50) of 0.1 µm to 10 µm, more preferably 0.5 µm to 5 µm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may have effect of decreasing contact resistance and line resistance.

The conductive powder may be present in an amount of 60 wt % to 95 wt % based on the total weight of the composition. Within this range, the conductive powder can prevent deterioration in conversion efficiency due to increase in resistance. Advantageously, the conductive powder may present in an amount of 70 wt % to 90 wt %.

(B) Glass Frit

The glass frit serves to enhance adhesion between the conductive powder and the wafer or the substrate and to form silver crystal grains in an emitter region by etching an anti-reflection layer and melting the silver powder so as to reduce contact resistance during a baking process of the electrode paste. Further, during the baking process, the glass frit is softened and decreases the baking temperature.

When the area of the solar cell is increased in order to improve solar cell efficiency, there can be a problem of increase in contact resistance of the solar cell, thus, it is advantageous to minimize serial resistance (Rs) and influence on the p-n junction while maximizing open voltage (Voc). In addition, as the baking temperatures varies within a broad range with increasing use of various wafers having different sheet resistances, the glass frit should secure sufficient thermal stability to withstand a wide range of baking temperatures.

Furthermore, solar cells are connected to each other by a ribbon to constitute a solar cell battery, it can cause detachment of the cells or deterioration in reliability when the adhesive strength between solar cell electrodes and the ribbon is not sufficiently secured.

In present invention, in order to ensure that the solar cell has electrical properties and physical properties such as an adhesive strength, a bismuth oxide-tellurium oxide-zinc oxide-lithium oxide-based ($Bi_2O_3$—$TeO_2$—$ZnO$—$LiO_2$) glass frit is used.

In one embodiment, the bismuth oxide-tellurium oxide-zinc oxide-lithium oxide-based glass frit may contain 5 wt % to 20 wt % of bismuth oxide, 55 wt % to 80 wt % of tellurium oxide, 0.1 wt % to 15 wt % of zinc oxide, and 0.1 wt % to 10 wt % of lithium oxide, preferably 60 wt % to 80 wt % of tellurium oxide. Within this range, the glass frit can secure both excellent adhesive strength and excellent conversion efficiency.

In another embodiment, the glass frit may further include 0.1 wt % to 10 wt % of tungsten oxide ($WO_3$).

In a further embodiment, the glass frit may further include at least one metal oxide selected from the group consisting of phosphorous oxide ($P_2O_5$), silicon oxide ($SiO_2$), magnesium oxide (MgO), cerium oxide ($CeO_2$), strontium oxide (SrO), molybdenum oxide ($MoO_3$), titanium oxide ($TiO_2$), tin oxide (SnO), indium oxide (In2O3), vanadium oxide ($V_2O_5$), barium oxide (BaO), nickel oxide (NiO), copper oxide ($Cu_2O$ or CuO), sodium oxide ($Na_2O$), potassium oxide ($K_2O$), antimony oxide ($Sb_2O_3$, $Sb_2O_4$ or $Sb_2O_5$), germanium oxide ($GeO_2$), gallium oxide ($Ga_2O_3$), calcium oxide (CaO), arsenic oxide ($As_2O_3$), cobalt oxide (CoO or $Co_2O_3$), zirconium oxide ($ZrO_2$), manganese oxide (MnO, $Mn_2O_3$ or $Mn_3O_4$), aluminum oxide ($Al_2O_3$), and boron oxide ($B_2O_3$). These metal oxides may be present in an amount of 0.1 wt % to 5 wt % relative to the total weight of the glass frit.

Although the glass frit may further include lead oxide (PbO), lead-free glass frits are more advantageous in that the lead-free glass frits provide excellent adhesive strength.

The glass frit may be prepared from such metal oxides by any typical method. For example, the metal oxides may be mixed in a predetermined ratio. Mixing may be carried out using a ball mill or a planetary mill. The mixed composition is melted at 900° C. to 1300° C., followed by quenching to 25° C. The obtained resultant is subjected to pulverization under a disk mill, a planetary mill, or the like, thereby providing a glass frit.

The glass frit may have an average particle diameter D50 of 0.1 µm to 10 µm, and may be present in an amount of 0.5 wt % to 20 wt % based on the total amount of the composition. The glass frit may have a spherical or amorphous shape.

(C) Organic Vehicle

The organic vehicle imparts suitable viscosity and rheological characteristics for printing to the paste composition through mechanical mixing with the inorganic component of the composition for solar cell electrodes.

The organic vehicle may be any typical organic vehicle used for the composition for solar cell electrodes, and may include a binder resin, a solvent, and the like.

The binder resin may include acrylate resins or cellulose resins, or the like. Ethyl cellulose is generally used as the binder resin. In addition, the binder resin may use ethyl hydroxyethyl cellulose, nitrocellulose, blends of ethyl cellulose and phenol resins, alkyd resins, phenol resins, acrylate ester resins, xylene resins, polybutane resins, polyester resins, urea resins, melamine resins, vinyl acetate resins resins, wood rosin, polymethacrylate of alcohols, and the like.

The solvent may include, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, y-butyrolactone, ethyl lactate, and combinations thereof.

The organic vehicle may be present in an amount of 1 wt % to 30 wt % based on the total weight of the composition. Within this range, the organic vehicle can secure sufficient adhesive strength and excellent printability.

(D) Additives

The composition may further include typical additives, as needed, to enhance flow properties, process properties, and stability. The additives may include dispersants, thixotropic agents, plasticizers, viscosity stabilizers, anti-foaming agents, pigments, UV stabilizers, antioxidants, coupling agents, and the like, and may be used alone or as mixtures thereof. These additives may be present in an amount of 0.1 wt % to 5 wt % based on the total weight of the composition, but this amount may be changed as needed.

Solar Cell Electrode and Solar Cell including the Same

Other aspects of the present invention relate to an electrode formed of the composition for solar cell electrodes and relate to a solar cell including the same. FIG. 1 shows a solar cell structure in accordance with one embodiment of the present invention.

Referring to FIG. 1, a rear electrode 210 and a front electrode 230 may be formed by printing and baking the composition for solar sell electrodes on a wafer or substrate 100 that includes a p-layer 101 and an n-layer 102, which will serve as an emitter. For example, a preliminary process for preparing the rear electrode 210 is performed by printing the composition for solar sell electrodes on the rear surface of the wafer and drying at about 200° C. to about 400° C. for about 10 to 60 seconds. Further, a preliminary process for preparing the front electrode may be performed by printing the composition for solar sell electrodes on the front surface of the wafer and drying. Then, the front electrode and the rear electrode may be formed by baking the wafer at 400° C. to 1000° C., preferably at 850° C. to 1000° C., for about 30 to 50 seconds.

Next, the present invention will be described in more detail with reference to examples. However, it should be noted that these examples are provided for illustration only and should not be construed in any way as limiting the invention.

EXAMPLES

Example 1

Metal oxides were mixed according to the composition listed in Table 1 and subjected to melting and sintering at 900° C. to 1400° C., thereby preparing bismuth oxide-tellurium oxide-zinc oxide-lithium oxide-based glass frits having an average particle diameter (D50) of 2.5 μm.

As an organic binder, 0.8 wt % of ethylcellulose (STD4, Dow Chemical Company) was sufficiently dissolved in 8.5 wt % of butyl carbitol at 60° C., and 87 wt % of spherical silver powder (AG-4-8, Dowa Hightech Co. Ltd.) having an average particle diameter of 2.0 μm, 3 wt % of the prepared bismuth oxide-tellurium oxide-zinc oxide-lithium oxide-based glass frits, 0.2 wt % of a dispersant BYK102 (BYK-chemie) and 0.5 wt % of a thixotropic agent Thixatrol ST (Elementis Co., Ltd.) were added to the binder solution, followed by mixing and kneading in a 3-roll kneader, thereby preparing a composition for solar cell electrodes.

The prepared composition for solar sell electrodes was printed on a front surface of a crystalline mono-wafer by screen printing in a predetermined pattern, followed by drying in an IR drying furnace. Then, the composition for electrodes containing aluminum was printed on a rear side of the wafer and dried in the same manner. Cells formed according to this procedure were subjected by baking at 980° C. for 40 seconds in a belt-type baking furnace, and evaluated as to conversion efficiency (%), serial resistance Rs (Ω) and open voltage (Voc) using a solar cell efficiency tester CT-801 (Pasan Co., Ltd.). Then, flux was applied to the electrodes of the cells and bonded to a ribbon at 300° C. to 400° C. using a soldering iron (Hakko Co., Ltd.). Then, the resultant was evaluated as to adhesive strength (N/mm) at a peeling angle of 180° and a stretching rate of 50 mm/min using a tension meter (Tinius Olsen). The measured conversion efficiency, serial resistance, open voltage and adhesive strength are shown in Table 1.

Example 2 to 20 and Comparative Example 1 to 6

Compositions for solar cell electrodes were prepared and evaluated as to physical properties in the same manner as in Example 1 except that the glass frits were prepared in compositions as listed in Table 1. Results are shown in Table 1.

TABLE 1

|  | Composition of glass frit (unit: wt %) | | | | | Efficiency | Voc | Rs | Adhesive strength |
| --- | --- | --- | --- | --- | --- | --- | --- | --- | --- |
|  | Bi2O3 | TeO2 | ZnO | Li2O | WO3 | (%) | (mV) | (mΩ) | (N/mm) |
| Example 1 | 5.0 | 65.0 | 15.0 | 5.0 | 10.0 | 16.77 | 618.2 | 5.9 | 5.98 |
| Example 2 | 5.0 | 74.9 | 10.0 | 0.1 | 10.0 | 16.48 | 617.9 | 6.2 | 5.87 |
| Example 3 | 5.0 | 79.8 | 15.0 | 0.1 | 0.1 | 16.51 | 618.3 | 6.3 | 5.88 |
| Example 4 | 5.0 | 79.9 | 0.1 | 5.0 | 10.0 | 16.71 | 617.5 | 6.1 | 5.91 |
| Example 5 | 5.0 | 80.0 | 9.9 | 5.0 | 0.1 | 16.58 | 617.1 | 6.0 | 5.92 |
| Example 6 | 11.5 | 69.5 | 6.5 | 2.5 | 10.0 | 16.99 | 623.4 | 5.6 | 5.93 |
| Example 7 | 12.3 | 80.0 | 7.5 | 0.1 | 0.1 | 16.65 | 617.6 | 6.0 | 5.97 |
| Example 8 | 12.5 | 57.5 | 15.0 | 5.0 | 10.0 | 16.45 | 617.5 | 6.2 | 6.01 |
| Example 9 | 12.5 | 67.4 | 15.0 | 5.0 | 0.1 | 16.57 | 618.4 | 6.3 | 6.13 |
| Example 10 | 14.8 | 80.0 | 0.1 | 0.1 | 5.0 | 16.52 | 617.2 | 6.4 | 5.99 |
| Example 11 | 14.8 | 80.0 | 0.1 | 5.0 | 0.1 | 16.73 | 619.3 | 6.0 | 6.12 |
| Example 12 | 16.1 | 66.3 | 11.1 | 1.4 | 5.1 | 16.82 | 622.1 | 6.0 | 5.89 |
| Example 13 | 20.0 | 55 | 15.0 | 0.1 | 9.9 | 16.42 | 618.4 | 5.9 | 6.02 |
| Example 14 | 20.0 | 60 | 15.0 | 4.9 | 0.1 | 16.83 | 621.5 | 5.8 | 6.12 |
| Example 15 | 20.0 | 62.3 | 7.6 | 0.1 | 10.0 | 16.68 | 619.4 | 6.1 | 6.11 |
| Example 16 | 20.0 | 69.8 | 0.1 | 0.1 | 10.0 | 16.58 | 618.6 | 6.1 | 5.96 |
| Example 17 | 20.0 | 69.8 | 0.1 | 5.0 | 5.1 | 16.74 | 620.4 | 6.1 | 5.94 |
| Example 18 | 20.0 | 72.3 | 7.5 | 0.1 | 0.1 | 16.55 | 618.9 | 6.1 | 6.13 |
| Example 19 | 20.0 | 77.3 | 0.1 | 2.5 | 0.1 | 16.94 | 622.8 | 5.8 | 6.08 |
| Example 20 | 15.0 | 70.0 | 10.0 | 5.0 | 0.0 | 16.81 | 623.3 | 6.0 | 5.75 |
| Comparative Example 1 | 20.0 | 70.0 | 0.0 | 5.0 | 5.0 | 13.54 | 605.3 | 7.8 | 2.19 |
| Comparative Example 2 | 15.0 | 70.0 | 10.0 | 0.0 | 5.0 | 10.18 | 597.1 | 10.2 | 2.05 |

TABLE 1-continued

| | Composition of glass frit (unit: wt %) | | | | | Efficiency (%) | Voc (mV) | Rs (mΩ) | Adhesive strength (N/mm) |
|---|---|---|---|---|---|---|---|---|---|
| | Bi2O3 | TeO2 | ZnO | Li2O | WO3 | | | | |
| Comparative Example 3 | 25.0 | 60.0 | 5.0 | 5.0 | 5.0 | 10.29 | 596.7 | 10.1 | 2.54 |
| Comparative Example 4 | 10.0 | 85.0 | 0.0 | 5.0 | 0.0 | 11.91 | 600.4 | 9.9 | 2.67 |
| Comparative Example 5 | 15.0 | 60.0 | 20.0 | 5.0 | 0.0 | 13.78 | 608.1 | 8.4 | 3.57 |
| Comparative Example 6 | 15.0 | 60.0 | 5.0 | 15.0 | 5.0 | 10.68 | 599.4 | 10.5 | 2.54 |

As shown in Table 1, it was ascertained that the solar cell electrodes fabricated using the compositions prepared in Examples 1 to 20 had low serial resistance, high open voltage (Voc), and considerably high adhesive strength to the ribbons, thereby providing excellent conversion efficiency, as compared with those of Comparative Examples 1 to 6 wherein the compositions of the glass frits did not satisfy the present invention.

Although some embodiments have been described, it will be apparent to those skilled in the art that these embodiments are given by way of illustration only, and that various modifications, changes, alterations, and equivalent embodiments can be made without departing from the spirit and scope of the invention. The scope of the invention should be limited only by the accompanying claims and equivalents thereof.

The invention claimed is:

1. A composition for solar cell electrodes, the composition comprising:
60 wt % to 95 wt % of silver powder,
0.5 wt % to 20 wt % of a glass frit, and
1 wt % to 30 wt % of an organic vehicle,
the glass frit including:
    5 wt % to 20 wt % of bismuth oxide;
    55 wt % to 80 wt % of tellurium oxide;
    0.1 wt % to 15 wt % of zinc oxide;
    0.1 wt % to 10 wt % of lithium oxide; and
    0.1 wt % to 10 wt % of tungsten oxide ($WO_3$).

2. The composition according to claim 1, wherein the glass frit further includes one or more of phosphorous oxide ($P_2O_5$), silicon oxide ($SiO_2$), magnesium oxide (MgO), cerium oxide ($CeO_2$), strontium oxide (SrO), molybdenum oxide ($MoO_3$), titanium oxide ($TiO_2$), tin oxide (SnO), indium oxide ($In_2O_3$), vanadium oxide ($V_2O_5$), barium oxide (BaO), nickel oxide (NiO), copper oxide ($Cu_2O$ or CuO), sodium oxide ($Na_2O$), potassium oxide ($K_2O$), antimony oxide ($Sb_2O_3$, $Sb_2O_4$ or $Sb_2O_5$), germanium oxide ($GeO_2$), gallium oxide ($Ga_2O_3$), calcium oxide (CaO), arsenic oxide ($As_2O_3$), cobalt oxide (CoO or $Co_2O_3$), zirconium oxide ($ZrO_2$), manganese oxide (MnO, $Mn_2O_3$ or $Mn_3O_4$), aluminum oxide ($Al_2O_3$), or boron oxide ($B_2O_3$).

3. The composition according to claim 1, wherein the glass frit includes 60 wt % to 80 wt % of tellurium oxide.

4. The composition according to claim 1, wherein the glass frit has an average particle diameter (D50) of 0.1 μm to 10 μm.

5. The composition according to claim 1, wherein the silver powder has an average particle diameter (D50) of 0.1 μm to 10 μm.

6. The composition according to claim 1, further comprising: at least one additive selected from the group consisting of dispersants, thixotropic agents, plasticizers, viscosity stabilizers, anti-foaming agents, pigments, UV stabilizers, antioxidants, and coupling agents.

7. A solar cell electrode prepared from the composition for solar cell electrodes according claim 1.

* * * * *